(12) United States Patent  (10) Patent No.: US 7,747,272 B2
Parsa  (45) Date of Patent: Jun. 29, 2010

(54) WIRELESS ACCESS POINT WITH TEMPERATURE CONTROL SYSTEM

(75) Inventor: Kourosh Parsa, Riverside, CT (US)

(73) Assignee: Ortronics, Inc., New London, CT (US)

( * ) Notice: Subject to any disclaimer, the term of this patent is extended or adjusted under 35 U.S.C. 154(b) by 841 days.

(21) Appl. No.: 11/512,522

(22) Filed: Aug. 30, 2006

(65) Prior Publication Data

US 2007/0263856 A1 Nov. 15, 2007

Related U.S. Application Data

(63) Continuation-in-part of application No. 11/415,738, filed on May 1, 2006.

(51) Int. Cl.
*H04B 7/00* (2006.01)
(52) U.S. Cl. ............... 455/522; 455/420; 455/13.4; 455/127.1; 455/115.1
(58) Field of Classification Search ............... 455/522, 455/420, 13.4, 127.1, 127.2, 88, 115.1, 115.4
See application file for complete search history.

(56) References Cited

U.S. PATENT DOCUMENTS

| | | | |
|---|---|---|---|
| 4,892,212 A | 1/1990 | Andreyko | |
| 4,950,840 A | 8/1990 | Zetena | |
| 5,189,256 A | 2/1993 | Epple | |
| 5,287,555 A * | 2/1994 | Wilson et al. ............ | 455/115.1 |
| 5,487,185 A * | 1/1996 | Halonen .................. | 455/561 |
| 5,559,922 A | 9/1996 | Arnett | |
| 5,574,256 A | 11/1996 | Cottone | |
| 5,638,947 A | 6/1997 | Fenne | |
| 5,659,650 A | 8/1997 | Arnett | |
| 5,735,714 A | 4/1998 | Orlando et al. | |
| 5,745,523 A * | 4/1998 | Dent et al. .................. | 375/216 |
| 5,761,368 A | 6/1998 | Arnett et al. | |
| 6,018,514 A * | 1/2000 | Bickham et al. ............ | 370/217 |
| 6,108,331 A | 8/2000 | Thompson | |
| 6,116,946 A | 9/2000 | Lewis et al. | |
| 6,169,884 B1 * | 1/2001 | Funk ........................ | 455/522 |
| 6,222,124 B1 | 4/2001 | Pritchard et al. | |
| 6,243,526 B1 | 6/2001 | Garibay et al. | |

(Continued)

OTHER PUBLICATIONS

PERICOM Semiconductor Corporation, Application of the Week, Application: WiFi Access Point Reference Clocks, Oct. 15, 2003, Week 75, 2 pages.

(Continued)

*Primary Examiner*—Minh D Dao
(74) *Attorney, Agent, or Firm*—McCarter & English, LLP

(57) ABSTRACT

An access point device and access point system support wireless and/or wired communications. The access point includes temperature control functionality that is adapted to control/moderate the temperature within an access point. The temperature control functionality may operate to control the transmit power, the throughput or other operating parameters associated with the access point. The temperature control functionality may also actuate a cooling mechanism, e.g., a fan, associated with the access point. Load balancing may also be employed to reduce heat generation associated with an access point. The temperature control functionality may reside at the access point, e.g., a "fat" access point, or may reside at the wireless controller, e.g., a "thin" access point. Error voltage signals may also be generated and transmitted to a TCVCXO to control or moderate temperature conditions and heat generation.

33 Claims, 7 Drawing Sheets

U.S. PATENT DOCUMENTS

| | | | |
|---|---|---|---|
| 6,373,902 B1 * | 4/2002 | Park et al. | 375/296 |
| 6,475,022 B2 | 11/2002 | Tomino et al. | |
| 6,507,322 B2 | 1/2003 | Fang et al. | |
| 6,549,525 B2 * | 4/2003 | Odenwalder | 370/332 |
| 6,566,602 B1 | 5/2003 | Miller et al. | |
| 6,616,005 B1 | 9/2003 | Pereira et al. | |
| 6,659,947 B1 | 12/2003 | Carter et al. | |
| 6,748,154 B2 | 6/2004 | O'Leary et al. | |
| 6,867,362 B2 | 3/2005 | Cherniski et al. | |
| 6,954,622 B2 * | 10/2005 | Nelson et al. | 455/127.1 |
| 6,999,737 B2 * | 2/2006 | Ishihara | 455/126 |
| 7,027,431 B1 | 4/2006 | Thompson | |
| 7,059,895 B2 | 6/2006 | Murano | |
| 7,158,489 B1 * | 1/2007 | Knuutila et al. | 370/318 |
| 7,167,045 B1 * | 1/2007 | Son et al. | 330/130 |
| 7,274,947 B2 * | 9/2007 | Koo et al. | 455/522 |
| 7,366,482 B2 * | 4/2008 | Hara et al. | 455/127.1 |
| 2002/0009096 A1 * | 1/2002 | Odenwalder | 370/441 |
| 2002/0149670 A1 | 10/2002 | Gerszberg et al. | |
| 2003/0062990 A1 | 4/2003 | Schaeffer, Jr. et al. | |
| 2004/0013098 A1 | 1/2004 | Tseng et al. | |
| 2004/0033817 A1 | 2/2004 | Gorsuch et al. | |
| 2004/0073597 A1 | 4/2004 | Caveney et al. | |
| 2004/0121648 A1 | 6/2004 | Voros | |
| 2004/0160901 A1 * | 8/2004 | Raith | 370/252 |
| 2004/0180573 A1 | 9/2004 | Chen | |
| 2004/0192353 A1 | 9/2004 | Mason et al. | |
| 2004/0196835 A1 | 10/2004 | Binder | |
| 2004/0224638 A1 | 11/2004 | Fadell et al. | |
| 2005/0144237 A1 | 6/2005 | Heredia et al. | |
| 2005/0152306 A1 | 7/2005 | Bonnassieux et al. | |
| 2005/0152323 A1 | 7/2005 | Bonnassieux et al. | |
| 2006/0267936 A1 | 11/2006 | Hoeri | |
| 2009/0043441 A1 * | 2/2009 | Breed | 701/29 |
| 2009/0115597 A1 * | 5/2009 | Giacalone | 340/506 |

OTHER PUBLICATIONS

3com Data Sheet,3Com IntelliJack Switch Family Innovative "in the Wall" Solution: U.S.—Standard, May 2004, 9 pages.

3com Data Sheet,3Com IntelliJack Switch Family Innovative "in the Wall" Solution: U.S.—Standard, Jun. 2004, 4 pages.

http://www.3com.com/products/en_US: 3com Product Details, 3Com IntelliJack Switch NJ220, Jun. 2004, 6 pages.

http://www.3com.com/products/en_US: 3com Product Details, 3Com IntelliJack Switch NJ100, Jun. 2004, 5 pages.

http://www.cisco.com/en/US/products/hw/phones/ps379/prod_installation_guide09186a00800a8689.html Printed: Feb. 2, 2006, pp. 1-10.

http://www.nbxsoftware.com/accessories/wallmount.html, Printed: Feb. 2, 2006, p. 1 Product Literature, Wall Phone Jacks, Undated, Single Sheet.

* cited by examiner

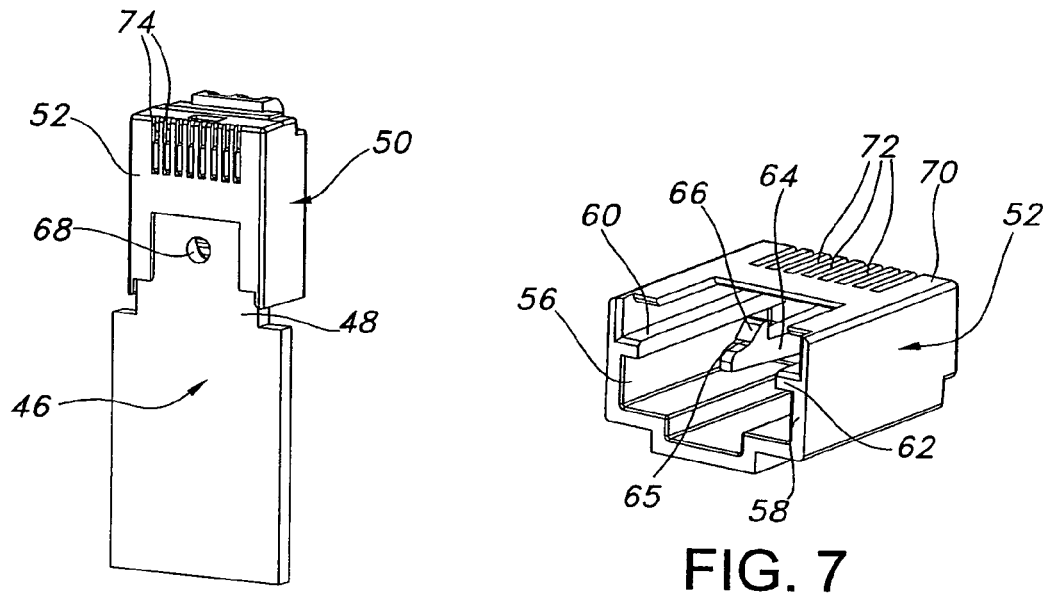
FIG. 6
FIG. 7
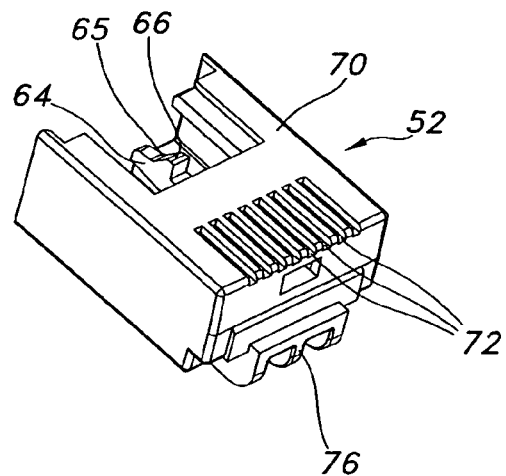
FIG. 8

WIRELESS ACCESS POINT WITH TEMPERATURE CONTROL SYSTEM

CROSS-REFERENCE TO RELATED APPLICATIONS

The present application is a continuation-in-part application claiming the benefit of a co-pending, commonly assigned non-provisional patent application entitled "Wireless Access Point" which was filed on May 1, 2006 and assigned Ser. No. 11/415,738. The contents of the foregoing non-provisional patent application are incorporated herein by reference.

BACKGROUND

1. Technical Field

The present disclosure is directed to access points for communication applications and, more particularly, to access points that include wireless functionality and that provide advantageous temperature control functionality. The disclosed access points are generally sized for mounting in or with respect to a conventional wall box and, beyond the disclosed wireless functionality, additionally support one or more jack and/or connector based communication modalities.

2. Background Art

In the field of communications, technological developments continue to drive the adoption of wireless technologies. For example, it has become commonplace for individuals to employ laptop computers with wireless communication capabilities to access and communicate across networks. Once wireless communication is established with a network, the laptop user can generally establish and/or engage in far reaching network-based communications, e.g., over local area networks, wide area networks, the Internet, etc. The backbone for such network-based communications, e.g., cabling, routers, switches, servers, nodes and the like, are generally known to persons skilled in the art.

Turning specifically to the segment of the communication process that involves wireless communication between an electronic device, e.g., a laptop computer, and a network, e.g., a local-area network (LAN), a wide-area network (WAN), a campus-area network (CAN), a metropolitan-area network (MAN), a home-area network (HAN), and combinations and/or extensions thereof, the wireless connectivity is generally achieved through the transmission and receipt of radio waves and/or microwaves. The electronic device that is to communicate in a wireless fashion typically includes a network interface card (NIC) or like device to support the wireless exchange of data communications. NICs are frequently designed for a particular type of network, protocol and/or media, although some NICs support communications across multiple networks. At the receiving end of the wireless communication, an access point is typically required. The access point typically takes the form of a hardware device and/or computer software that acts as a communication hub for users of a wireless device to connect to a wired network, e.g., a LAN, WAN and/or the Internet.

As used herein, the term "access point" encompasses a hardware device and/or associated software that acts as a communication hub for users of wireless devices to connect to a wired network. Conventional access points generally provide a predetermined level of security for wireless communications that pass through the access point, and extend the physical range of service to which a wireless user has access.

The term "Wi-Fi" is short for wireless fidelity and is meant to encompass any type of 802.11 network, whether 802.11b, 802.11a, 802.11g, dual-band, etc. The term "Wi-Fi" is currently promulgated by the Wi-Fi Alliance. Any products tested and approved as "Wi-Fi Certified" (a registered trademark) by the Wi-Fi Alliance are certified as interoperable with each other, even if they are from different manufacturers. Users with "Wi-Fi Certified" products can use any brand of access point with any other brand of client hardware that also is certified. Typically, however, any Wi-Fi product using the same radio frequency (e.g., 2.4 GHz for 802.11b or 802.11g, and 5 GHz for 802.11a) will work with any other, even if such products are not "Wi-Fi Certified." The term "Wi-Fi" is further intended to encompass future versions and/or variations of the foregoing communication standards. Each of the foregoing standards is hereby incorporated by reference.

A wireless access point thus functions as a bridge between a wired and a wireless network. Wireless access points function like a wireless hub connecting all the wireless devices together and then connecting them to a wired network. A wireless network access point is an essential part of a wireless network in that the access point facilitates connection to the Internet and/or another network. Many wireless access points are now built into wireless routers so that the features of a broadband router and a wireless access point are provided in one unit. Wireless access points generally have differing levels of performance, e.g., different wireless access points perform at varying data transmission speeds. Commercial manufacturers are producing units that offer wireless access functionality. Thus, for example, the NETGEAR (Santa Clara, Calif.) wireless access points have been built into broadband routers. LINKSYS (Irvine, Calif.), D-LINK (Fountain Valley, Calif.) and BELKIN (Compton, Calif.) also manufacture wireless broadband routers that include a built-in wireless access point. Ortronics, Inc. (New London, Conn.) has also offered a wireless access point, the Wi-Jack™, that offers wireless and non-wireless functionalities and is dimensioned/configured for mounting in and/or with respect to a conventional wall box, e.g., a single gang box.

Wireless access points are also appearing in what may be termed "hot spots" in hotels, train stations and airports. These access points are making wireless Internet connectivity available to travelers/individuals who can connect to the Internet or a desired network, e.g., a corporate network via a virtual private network (VPN), through wireless communication technology.

Existing 802.11 access points suffer from various limitations and/or drawbacks. For example, current Wi-Fi access points are generally bulky, need to be connected via a patch cord, and often require an external power cord. Moreover, conventional Wi-Fi access ports are difficult to integrate into a desired environment, and frequently result in a non-desirable and/or unacceptable physical presence in the desired environment.

With reference to the patent literature, commonly assigned U.S. Patent Publication No. 2005/0152306 to Bonnassieux is directed to an advantageous Wi-Fi access point device and system. The disclosed access point facilitates integration of operative aspects of a Wi-Fi access point in a wall using, for example, standard switch and outlet boxes and/or standard wall plates. Wiring structures, such as a 110 block, may be incorporated into the disclosed access point to facilitate connection to a wired network. Further, integration of complementary connections within the access point is supported, for example, data, voice, video, CATV or other like connection types. The entire contents of the foregoing, commonly assigned patent publication are incorporated herein by reference.

A second commonly assigned U.S. Patent Publication No. 2005/0152323 to Bonnassieux et al. discloses a plug-in Wi-Fi access point device and system. In this second patent publication, an access point device is provided that is configured for Wi-Fi communication that may be directly plugged into a face plate/workstation, thereby obviating the need for a patch cord. The disclosed plug-in functionality also offers security from removal by unauthorized personnel, non-obtrusiveness in relation to other face plate/workstation jacks, and the ability to be powered through an Ethernet connection to avoid the need for a separate power source. The disclosed plug-in Wi-Fi access point device includes a housing, Wi-Fi access point circuitry within the housing, and a connector mounted on a face of the housing for direct plug-in into an Ethernet jack of a face plate/workstation. A locking or self-locking mechanism, an integrated hub/switch/router, and the inclusion of at least one integrated voice, video and/or data jack for voice, video or data communication, are also disclosed. The entire contents of the foregoing, commonly assigned patent publication are incorporated herein by reference.

U.S. Pat. Nos. 6,108,331 and 7,027,431 to Thompson discloses an access node or access port that has a plurality of physical connectors on the front face thereof for connection to a variety of signal-receiving and signal-transmitting devices. The Thompson access ports include RJ-45 connectors, RCA connectors, serial connectors, Ethernet connectors, and coaxial cable connectors. Conduits, i.e., signal-carrying media such as media converters, deliver signals to the access port. The signals are converted to and from addressed data packets carried in a packet stream over the conduits. Separate from the access port, a central node or node zero receives signals from outside sources, converts the signals to addressed data packets, and sends the packets over the conduit(s) as a packet stream to the access port. The access port/access node takes packets that are addressed to such access port/access node, converts the packets back into the original signals, then feeds the signals to appropriate connectors on the access port/access node. The Thompson access port/access node is also provided with a transceiver in wireless communication with another transceiver connected to a device outside the node using RF or infrared communication.

A further issue associated with access points and related electronics involves heat generation and the potential impact of such heat generation on system operation/performance. Indeed, various trends in access point design and installation, e.g., increased miniaturization, in-wall installation, high traffic loading, and multi-mode operation, increase the risk that access point operation will exceed the temperature ratings of internal components and/or otherwise degrade access point performance. Increasing temperatures may translate to increased noise, reduced system reliability, e.g., reduced mean time between failure (MTBF), and potential failure of one or more system components. Performance attributes of system components may be altered and/or negatively impacted by heat conditions, thereby reducing system performance from optimal levels. Power management issues associated with IEEE 802.11 systems have received preliminary attention (see, e.g., Hongyan Lee et al., "A Power Management Scheme for IEEE 802.11 Based WLAN," Performance, Computing and Communications Conference, 24$^{th}$ IEEE International, IPCCC 2005.)

However, despite efforts to date, a need remains for improved access point designs and access point systems that provide effective wireless functionality, manage heat and power-related issues, and facilitate installation. In addition, a need remains for access point designs and access point systems that support both wireless and non-wireless communications in a compact geometry, e.g., a unit that is sized to mount, in whole or in part, with respect to a conventionally sized wall box. These and other needs are satisfied by the disclosed access point devices and systems, as will be apparent to persons skilled in the art from the description which follows.

SUMMARY OF THE DISCLOSURE

The present disclosure provides advantageous access points, access point systems, and access point-related components, subassemblies and support structures that, alone or in combination, support a host of communication applications. More particularly, the present disclosure provides advantageous access points that include/support wireless functionality, yet may be sized for mounting in or with respect to a conventional wall box. In addition to the noted wireless functionality, the disclosed access points and access point systems generally support one or more jack and/or connector based communication modalities. Moreover, the disclosed access points and access point systems advantageously include functionality to monitor temperature conditions and to take one or more actions based on temperature-related parameters, e.g., action(s) reduce power usage, reduce heat generation and/or modify access point utilization and/or operation.

Thus, in a first exemplary embodiment of the present disclosure, an access point is provided that includes a plurality of printed circuit boards arranged in a substantially H-shaped or U-shaped configuration. In an exemplary embodiment of the disclosed access point, three (3) printed circuit boards are provided within the access point, such printed circuit boards being in electronic communication with each other so as to provide requisite control and operational processing capabilities. Communication interface members are typically provided to facilitate electrical communication between adjacent circuit boards. According to exemplary embodiments, a jack is positioned in close proximity to the circuit boards and is accessible from the front face of the access point. Thus, a user is able to insert a plug into the jack to facilitate network-based communications. One or more antennae are provided in the access point to support wireless functionality. In addition, a further connector is typically provided to facilitate to permit connection of the access point to associated wired infrastructure. Thus, in an exemplary embodiment, an outwardly directed plug extends from the access point and facilitates communication with external sources, e.g., network-related communications and the like.

In exemplary embodiments of the present disclosure, the outwardly directed connector takes the form of an outwardly/rearwardly directed plug that is advantageously formed from a printed circuit board and a plug housing. The circuit board is adapted to slide into the plug housing and become latched/locked therein. Thus, regardless of the overall size/dimensional characteristics of the circuit board, at least a portion or region of the circuit board is sized and dimensioned to cooperate with the plug housing in the manner described herein. A plurality of exposed contacts, e.g., eight, are provided on the printed circuit board, and such contacts are adapted to be exposed in channels defined by the plug housing. The exposed contacts are advantageously in electrical communication with the traces on the printed circuit board and, through such traces, with other electronic components associated with the disclosed access point. The circuit board/plug housing subassembly may be advantageously integrated into an access point design, as described herein, are employed independent therefrom, e.g., in connection with other electronic devices and/or assemblies.

The circuit boards associated with the disclosed access points are adapted to support and manage the various functionalities of the access point, e.g., the receipt, processing and transmission of signals, power processing and management, and the generation of signals reflecting operative conditions and the like. The H-shaped or U-shaped configuration of the circuit boards disclosed herein permits advantageous space utilization and permits the disclosed access points to be utilized in conjunction with a conventional electrical box, e.g., a single gang wall box, while supporting a full range of access point functionalities, including the processing of both wireless and wired communications.

In a further aspect of the present disclosure, an advantageous electrical box receptacle is disclosed. The receptacle defines an open corner region in the rear thereof. The open corner region facilitates wiring connections associated with electrical components that may be introduced thereto, e.g., access points of the type disclosed herein. Thus, for example, an outwardly/rearwardly directed plug associated with an exemplary access point of the present disclosure may engage a jack in the open corner region of the disclosed receptacle, thereby enhancing the ease of wiring and avoiding potential damage to the electrical components in the mating region.

With reference to the temperature-related functionalities associated with exemplary embodiments of the disclosed access points and access point systems, one or more temperature sensors are associated with the access point, e.g., in conjunction with circuit board(s) or other internal electronic component. The temperature sensor(s) communicate with a control system, e.g., control logic, that may be reside within the access point or at a remote location, e.g., at controller. The control system is adapted to monitor the measured temperature conditions and, based on predetermined criteria, to initiate one or more actions that are designed to influence or control the temperature parameter. For example, the control system may be adapted to cause reduced power consumption at the access point, e.g., by reducing access point throughput, reducing transmission power, load balancing across two or more access points, and the like. In still further embodiments of the present disclosure, the disclosed temperature sensing functionality may cooperate with a correlation mechanism, e.g., a predefined table or translation algorithm, to generate desired voltage corrections for transmission to an oscillator, e.g., a temperature controlled/voltage controlled crystal oscillator (TCVCXO). In this way, oscillator operation may be controlled within desired ranges.

Additional advantageous features and functions of the disclosed devices, systems and methods will be apparent from the detailed description which follows, particularly when read in conjunction with the appended figures.

BRIEF DESCRIPTION OF THE FIGURES

To assist those of ordinary skill in the art in making, installing and using the disclosed access points and access point systems, including assemblies and subassemblies thereof, and exemplary wall receptacles for receipt and/or support of access point devices (and other communication devices), reference is made to the accompanying drawings, wherein:

FIG. 6 is a side view of an exemplary printed circuit board and jack housing subassembly according to an aspect of the present disclosure;

FIG. 7 is a rear plan view of an exemplary jack housing according to an aspect of the present disclosure;

FIG. 8 is a front plan view of the exemplary jack housing of FIG. 7.

DESCRIPTION OF EXEMPLARY EMBODIMENT(S)

Figure 1:
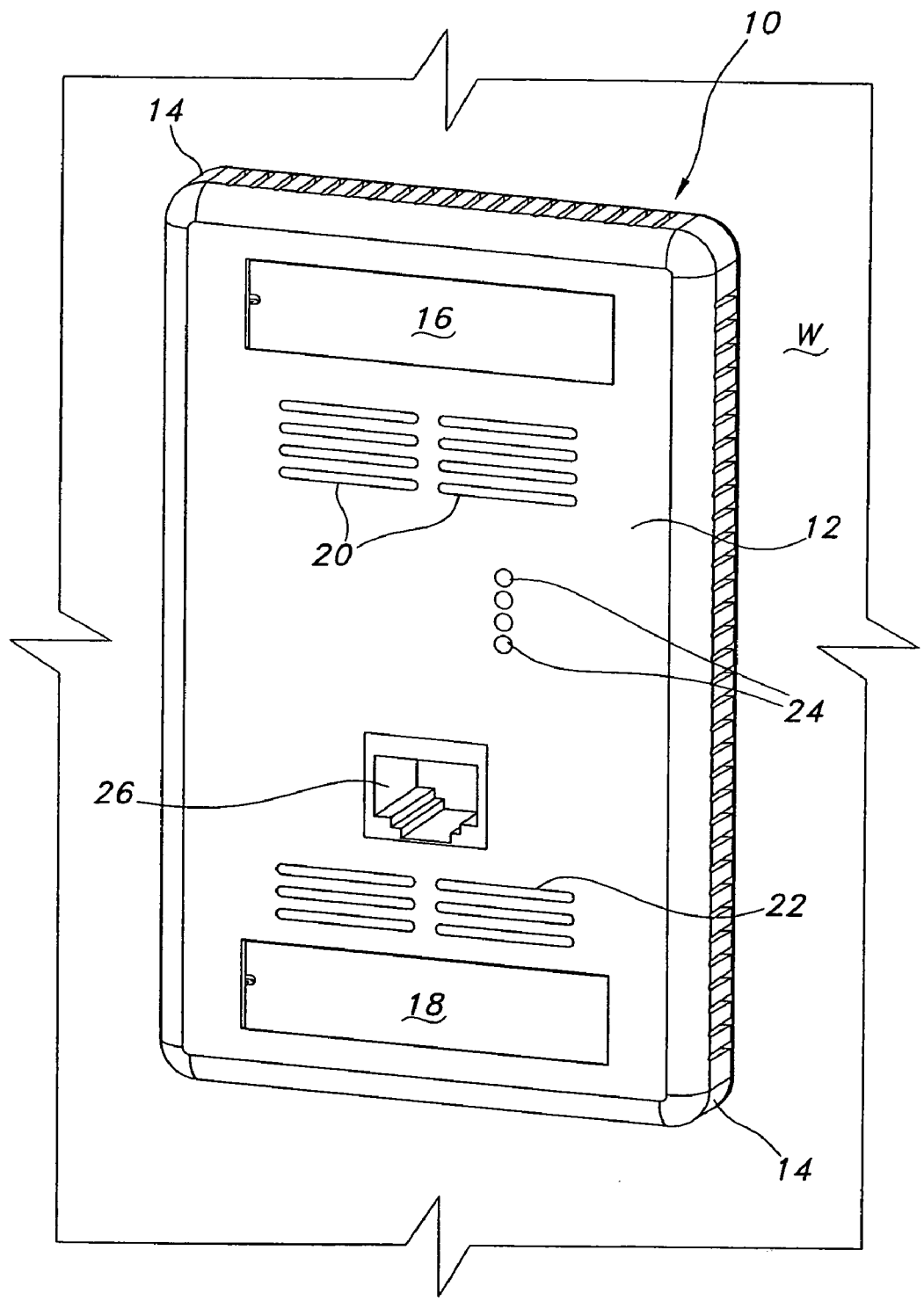
FIG. 1 is a front view of an exemplary access point device mounted with respect to a wall according to the present disclosure.

As described herein with reference to exemplary embodiment(s), the present disclosure provides access points, access point systems and access point-related components, subassemblies and support structures that, alone or in combination, support a host of communication applications. The disclosed access points and access point systems include and/or support wireless functionality. Thus, in exemplary embodiments of the present disclosure, the disclosed access points include one or more antennae that are adapted to transmit and receive wireless communications. The disclosed access points also include a printed circuit board layout that supports, inter alia, the disclosed antennae and a full range of signal/data processing functionalities, e.g., Ethernet-based signal transmission/receipt functionalities. Power is delivered to the disclosed access point components through Power-over-Ethernet (PoE) techniques, as are known in the art.

As used herein, "Power-over-Ethernet" or PoE technology refers to any system to transmit electrical power, along with data, to remote devices over standard twisted-pair cable in an Ethernet network. PoE technology is particularly useful for powering IP telephones, wireless LAN access points, webcams, Ethernet hubs, computers, and other appliances. Power-over-Ethernet is currently standardized in IEEE 802.3af. According to the IEEE 802.3af standard, 48 volts DC is provided over two pairs of a four-pair cable at a maximum current of 350 mA for a maximum load power of 15.4 watts. A modified standard that may increase power and/or current specifications is under discussion (IEEE 802.3at). Before applying power, an IEEE 802.3af power source first determines if a remote device can accept power, and if so, which pairs should be used to supply it. If an open or a short circuit is detected, no power is applied so as to protect devices that do not support IEEE 802.3af and/or otherwise are not calling for power. The IEEE 802.3af standard is incorporated herein by reference.

In exemplary embodiments of the disclosed access point, network communication is effected through a cable, cord or other data communication conduit that engages an outwardly directed plug associated with the disclosed access point. Exemplary plugs of the present disclosure include an integral printed circuit board which contributes to the support of the access point's functionality and, in disclosed embodiments, cooperates with one or more additional printed circuit boards positioned within the access point to provide such support. In exemplary embodiments, the plug is rearwardly directed from the access point housing and aligns with an opening defined in an advantageous receptacle, e.g., a receptacle that is adapted for wall mounting. The receptacle opening facilitates passage of one or more cables, wires, cords and/or other conduits and mating of such conduit with a connector associated with the access point, e.g., a rearwardly directed plug. Indeed, in an exemplary embodiment, a single cable/conduit is fed through the receptacle opening, such cable/conduit including a jack that is adapted to engage a rearwardly directed plug associated with the access point. In this way, installation/wiring of the disclosed access point is further facilitated.

With reference to FIG. 1, an exemplary access point 10 mounted to a wall "W" is depicted. Although access point 10 is depicted in conjunction with a wall W, it is to be understood that access point 10 may be mounted with respect to a variety of surfaces and structures, e.g., a ceiling, floor, cabinet, furniture console, desk, credenza and the like. Access point 10 is substantially rectangular in geometry and thereby substantially conforms to the geometry of conventional wall boxes, e.g., a single gang wall box. Access point 10 includes a front housing member 12 that functions, in part, as a face-plate for the disclosed access point. Front housing member 12 may define radiused corners 14 for enhanced aesthetics. First and second covers 16, 18 are mounted to front housing member 12 after access point 10 is mounted with respect to wall W, thereby covering the mounting screws and/or other mounting components used to secure access point 10 with respect to wall W.

A plurality of vent openings are generally defined in the front face of front housing member 12 to facilitate cooling of the componentry positioned within access point 10. Thus, in the exemplary embodiment of FIG. 1, front housing member 12 includes a plurality of vertically spaced elongated vent slots 20, 22. Vent slots 20 are positioned toward the top of front housing member 12 adjacent first cover 16, and vent slots 22 are positioned therebelow, adjacent second cover 18. Alternative venting arrangements may be implemented, as will be apparent to persons skilled in the art. Generally, vent openings are positioned so as to facilitate effective cooling air flow through front housing member 12 and past the operative components positioned within access point 10.

A plurality of indicator windows 24 are positioned on the front face of front housing member 12. Indicator windows 24 generally take the form of light passage elements and, as described with reference to the exploded view of FIG. 3 below, may cooperate with light pipes and/or other structures, e.g., LEDs, to fulfill the signaling function contemplated therefor. Thus, in an exemplary embodiment of the present disclosure, the disclosed access point 10 includes internal circuitry and/or programming that generates light signal(s) in response to the receipt and/or transmission of data. As will be apparent to persons skilled in the art, the number, positioning and operation of indicator windows 24 may be varied based on the desired indicia/information to be communicated to system users.

An RJ-45 jack 26 is also mounted with respect to and accessible at the front face of front housing member 12. Jack 26 may take a variety of forms, although a jack that meets high-end performance standards is preferred, e.g., a jack that is CAT 6, CAT 5e and/or CAT 5 compliant. As is well known in the art, RJ-45 jack 26 is adapted to receive/engage a corresponding plug (not pictured) for data communication therebetween. Although exemplary access point 10 features a single RJ-45 jack 26, it is contemplated that one or more additional jacks/connectors may be accessible at the front face of front housing member 12. Once a plug is mounted in RJ-45 jack 26, data and/or power may be transmitted to an electronic device associated with the plug, e.g., a computer, printer, server, or other device/instrument, based on PoE technology as described above. Although RJ-45 jack 26 is centrally positioned above vent slots 22, alternative location(s) may be selected on the front face of front housing member 12, as will be apparent to persons skilled in the art. Generally, RJ-45 jack 26 is aligned with cavity 108 of rear housing 106 (as described below) so as to minimize the depth of access point 10 relative to the wall or other structure upon which it is mounted.

Figure 2:
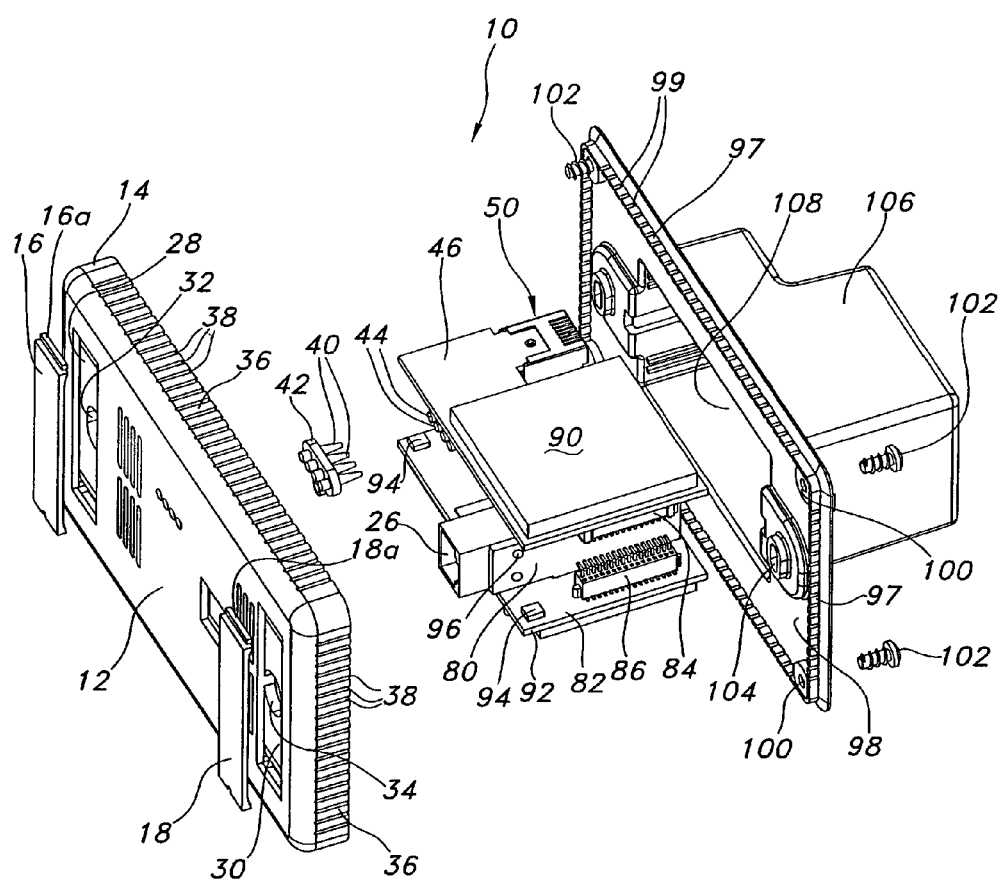
FIG. 2 is a partially exploded view of an exemplary access point device according to the present disclosure.

Turning to FIG. 2, a partially exploded side view of access point 10 is provided. Covers 16, 18 are separated from front housing member 12, thereby revealing internal cavities 28, 30 and mounting apertures 32, 34, respectively. Screws or other mounting members (not pictured) generally cooperate with mounting apertures 32, 34 to detachably secure access point 10 with respect to a wall or other structure. In addition, exemplary edge features, e.g., mounting ledges 16a, 18a, that facilitate detachable mounting of covers 16, 18 relative to front housing member 12 are apparent in FIG. 2. Front housing member 12 also defines side walls 36 that define a plurality of venting notches 38. Venting notches 38 further facilitate cooling air flow through access point 10, while simultaneously providing a pleasing aesthetic appearance to access point 10.

A plurality (4) of light delivery elements 40 for cooperation with indicator windows 24 on the front housing member 12 are assembled as a subassembly by positioning each light delivery element 40 within a cooperative aperture in assembly plate 42. Light delivery elements 40 cooperate with corresponding light channels or LEDs 44 that are mounted with respect to and are in electronic communication with a first printed circuit board 46 within access point 10. Assembly plate 42 generally functions to facilitate handling and assembly of the light delivery elements 40 relative to indicator windows 24 and LEDs/light channels 44 of exemplary access point 10.

With reference to FIGS. 2 and 6-8, first printed circuit board 46 cooperates with and is mounted to a plug housing 52 to define a plug member 50 at a rearward and/or outward portion of access point 10. Thus, with particular reference to FIGS. 6-8, exemplary embodiments of the present disclosure include an integrally defined printed circuit board and RJ-45 plug, such that data communication with the printed circuit board and the associated components of access point 10 is greatly facilitated. Of note and with particular reference to FIG. 6, printed circuit board 46 is schematically depicted therein for purposes of describing the interaction of circuit board 46 with plug housing 52. For illustration purposes, the full geometry and dimensional characteristics of exemplary printed circuit board 46 are not reflected in FIG. 6, as is apparent from a comparison with FIG. 2. However, FIGS. 6-8 are particularly useful in describing the assembly and operation of exemplary plug housing 52 and associated printed circuit board 46 to define plug 50.

As best seen in FIGS. 7 and 8, plug housing 52 is generally sized in a manner consistent with RJ-45 dimensional requirements and defines an internal cavity 54. Printed circuit board 46 defines an upper portion 48, the width of which is selected so as to cooperate with the internal width of cavity 54. Internally stepped side walls 56, 58 define sliding surfaces 60, 62 upon which upper portion 48 may slide when brought into engagement with plug housing 52. A locking structure 64 is positioned within cavity 54 and includes a locking tooth 66 that is downwardly deflectable. With reference to FIG. 7, a corresponding locking aperture 68 is formed in the upper portion 48 of printed circuit board 46. Top face 70 of plug housing 52 defines eight (8) aligned channels for alignment with exposed contacts 74 formed on the end region of the printed circuit board's upper portion 48. The exposed contacts 74 are in electrical communication with traces (not pictured) that traverse printed circuit board 46. A lower extension structure 76 is formed on or by plug housing 52, such that the overall geometry of plug housing 52 corresponds to a conventional RJ-45 geometry. Thus, when printed circuit board 46 is assembled with plug housing 52, the exposed contacts of printed circuit board 46 are available for electrical communication with a corresponding jack, such that an advantageous RJ-45 plug 50 is defined by the combination of circuit board 46 and plug housing 52.

To assemble an exemplary embodiment of the disclosed printed circuit board and plug housing so as to define an RJ-45 plug subassembly, a printed circuit board is generally provided having the following features/characteristics: (i) exposed contacts (8) that are configured and dimensioned to align with the slots formed in the plug housing, (ii) an appropriate width to slide in the region defined within the plug housing, e.g., between stepped side walls thereof, (iii) a thickness that will be accommodated, e.g., slide, within the plug housing, e.g., in the region defined between slide surfaces formed by stepped side walls and the top face of the plug housing, and (iv) a locking aperture formed in a location to cooperate/engage with a corresponding locking tooth formed in the plug housing. Alternative locking mechanisms/techniques may be employed to secure the printed circuit board with respect to the plug housing, as will be readily apparent to persons skilled in the art, e.g., detent features formed on the stepped side walls of the plug housing.

Assembly of exemplary plug 50 generally involves sliding a printed circuit board along sliding surfaces defined by the stepped side walls of plug housing 52, with locking tooth 66 deflected downward. A ramped surface 65 is provided to facilitate downward deflection of locking tooth 66 as circuit board 46 is introduced to plug housing 52. Once printed circuit board 46 is advanced to the desired location relative to plug housing 52 (i.e., with the exposed contacts available for electrical communication with a corresponding RJ-45 jack), the locking tooth 66 is brought into alignment with aperture 68 and deflects into engagement with such aperture 68 formed in printed circuit board 46. In exemplary embodiments of the present disclosure, the printed circuit board 46 is approximately 1.6 mm in thickness (or less) in the region to be introduced to plug housing 52. The portion of the plug housing cavity that is below the printed circuit board (i.e., opposite the exposed contacts) may accommodate additional electrical components that may be mounted to printed circuit board 46, e.g., component(s) for noise reduction and the like.

With further reference to the exploded view of FIG. 2, printed circuit board 46 contains only a portion of the circuitry required to support the function of access port 10. Thus, a pair of additional printed circuit boards 80, 82 are in electrical communication with printed circuit board 46. Electrical communication between the traces on the respective printed circuit boards 46, 80, 82 is effected by communication interface members 84, 86. Thus, printed circuit board 46 is in electrical communication with printed circuit board 80 (and vice versa) through interface member 84. Similarly, printed circuit board 80 is in electrical communication with printed circuit board 82 (and vice versa) through interface member 86. Generally, printed circuit boards 46 and 82 can only communicate with each other via intermediate printed circuit board 80. The three printed circuit boards define a substantially H-shape or U-shape configuration, with interface members 84, 86 positioned within the confines of the H-shaped or U-shaped region. Intermediate circuit board 80 is generally secured to the underside of jack 26, e.g., with a bolt, rivet or other attachment means 96.

Additional electrical components, e.g., capacitors, resistors, inductors, additional circuit board elements and the like, may be mounted with respect to one or more of the circuit boards. Such additional electronic components are schematically depicted by members 90, 92. Although members 90, 92 are unitary in appearance, it is to be understood that such schematic depictions encompass a host of individual electrical components, as will be readily apparent to persons skilled in the art. The close spatial relationship between jack 26, circuit boards 46, 80, 82 (jack 26 is generally bounded by the three circuit boards) and additional electronic components 90, 92 facilitates efficient communication therebetween.

A pair of antenna are generally associated with access device 10 to support wireless communication functionalities. The antennae (not pictured) are generally secured to the inner face of front housing member 12, thereby conserving space and positioning antennae for unobstructed communication with devices/transmitters positioned in the vicinity of access point 10. A variety of mounting techniques may be employed, e.g., the inclusion of guide slots/tracks on the inner face of front housing member 12 to receive/secure each antenna. A screw/nut arrangement 94 is used to secure leads that extend from the antennae with respect to printed circuit boards 46, 82, respectively, although alternative means for achieved electrical connection between the antennae and the printed circuit boards may be employed. The antennae are generally of conventional design although, in exemplary embodiments of the present disclosure, the antennae advantageously provide dual band omni-directional functionalities that support communications pursuant to both IEEE 802.11b/g and 802.11a standards. IEEE 802.11 sets forth the general Wi-Fi communication standards and includes a series of amendments, namely the b, a, and g amendments to the original standard. The 802.11b and 802.11g standards use the 2.4 gigahertz (GHz) band, whereas the 802.11a standard uses the 5 GHz band.

The antennae derive their power from the respective printed circuit boards 46, 82. The requisite power is derived from the network to which the access point is connected as power-over-Ethernet. Thus, neither a separate power source nor a separate power cable is required to power the access point, including specifically the transceiving components thereof. Of note, in circumstances where both wireless communication modes are being called upon simultaneously (i.e., wireless communications are being received and/or transmitted at both 2.4 and 5 GHz) within access point 10, additional heat is typically generated due to the simultaneous operation of electronic components and circuitry associated with the processing of both communication modes. According to exemplary embodiments of the present disclosure, a temperature sensor (not pictured) is mounted with respect to at least one of the circuit boards 46, 80, 82. Control circuitry associated with the printed circuit board(s) monitors the temperature readings of the temperature sensor and, if the temperature reaches a predetermined threshold that may impact upon the stability and/or operation of access point 10, operations of the access point are restricted so as to reduce power draw/heat generation. Thus, in an exemplary embodiment of the present disclosure, if the control circuitry senses a temperature that exceeds the predetermined threshold, the speed with which the dual mode operations are processed may be moderated/reduced so as to reduce the power needs of access point, thereby reducing heat generation and the associated temperature internal to access point 10. Once the temperature drops below a second predetermined threshold, the control circuitry typically withdraws the previously implemented power restriction, thereby permitting the access point 10 to return to full operation. Of note, the response of the control circuitry need not operate as a "step function", but may moderate the power usage of access point 10 at a variable level based on algorithmic control functions associated with such control circuitry.

With further reference to temperature-related functionalities associated with exemplary embodiments of the disclosed access points and access point systems, one or more temperature sensors may be advantageously associated with the access point. Thus, in a first exemplary embodiment, a temperature sensor is mounted with respect to a circuit board, e.g., circuit board 46, 80 or 82, to monitor temperature conditions within the access point. Exemplary temperature sensors draw limited current from the circuit board/electronic system, e.g., 60 micro amps, and provides an output voltage that is proportional to the measured temperature conditions. The measured temperature conditions are typically communicated to a temperature control system associated with the disclosed access point. The temperature control system may reside, in whole or in part, on one or more of the circuit boards positioned within the access point, e.g., circuit boards 46, 80 and/or 82 within access point 10. The temperature control system may also reside, in whole or in part, on an access point controller that is remote from access point 10. Thus, the disclosed temperature control system/functionality may be implemented in systems that include a "fat" access points and "thin" access points. In deployments that include fat access points, the temperature control system generally resides, in whole or in part, at the access point, whereas in thin access point deployments, the temperature control functionality generally resides remote from the thin access point, e.g., at or in conjunction with the associated system controller.

Figure 9:
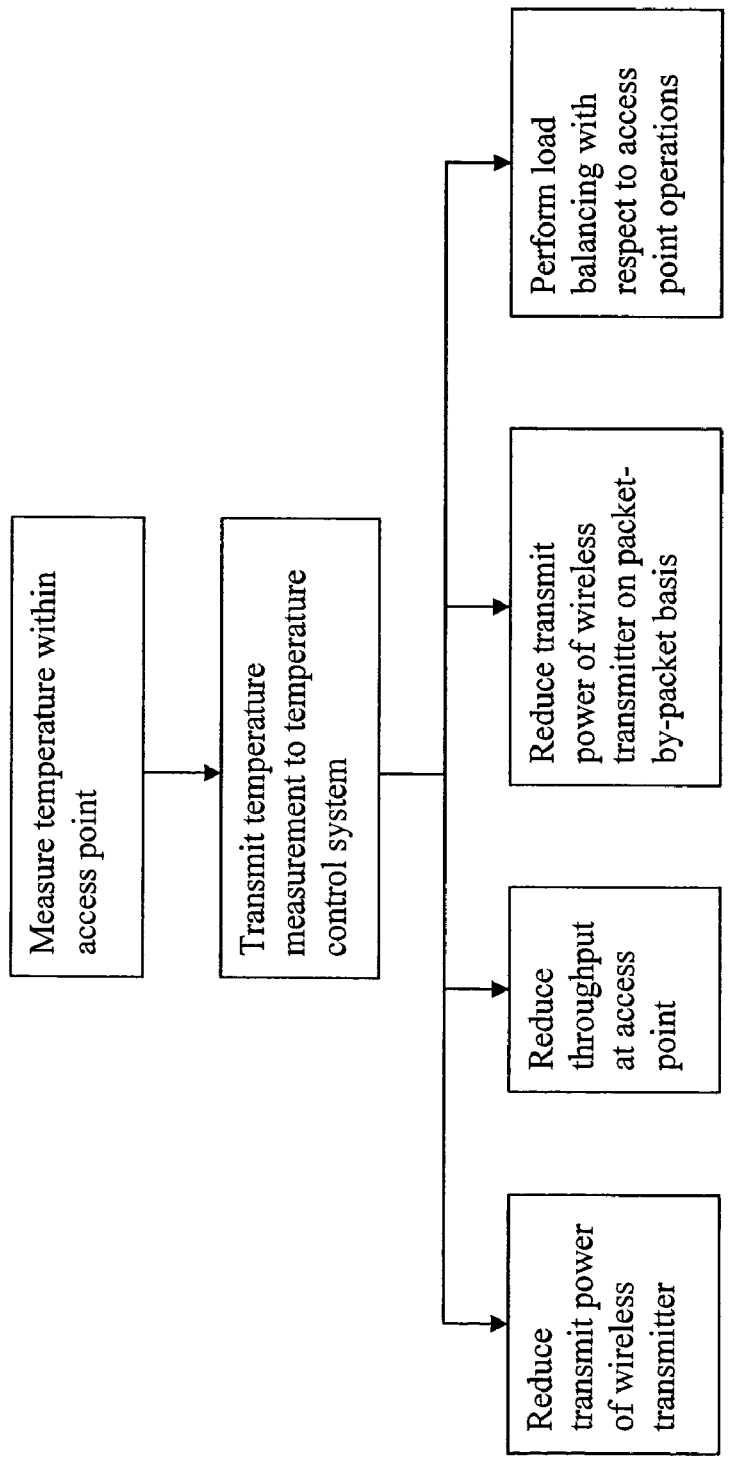
FIG. 9 is a flow chart depicting implementations of exemplary temperature control systems according to the present disclosure.

With reference to FIG. 9, a flow chart associated with implementation of exemplary embodiments of the disclosed temperature control systems is provided. Thus, as shown in FIG. 9, the initial step in connection with the disclosed temperature control system/methodology involves measurement of the temperature within an access point. The temperature measurement may be at or adjacent the circuit board(s) within the access point and/or at or adjacent other componentry positioned therewithin, e.g., a transmitter/receiver. Multiple temperature sensors may be positioned within the access point and the temperature measurements from each such temperature sensor may be processed for control purposes. Of note, the disclosed temperature sensors are generally adapted to generate temperature measurements on a continuous or substantially continuous basis, although it is further contemplated that temperature measurements may be generated in response to a query from a temperature control system, i.e., on an as-requested basis.

As further depicted in FIG. 9, the temperature measurement generated by the temperature sensor(s) are communicated/transmitted to a temperature control system. As discussed above, the temperature control system may reside, in whole or in part, at the access point, or it may reside in a remote location, e.g., at or in conjunction with a wireless control system. The temperature measurements may be communicated/transmitted across associated circuitry, e.g., copper and/or fiber optic wires, cables and/or traces. Alternatively, temperature measurement data may be wirelessly transmitted from the access point to a remote location, e.g., by the wireless transmission system associated with the access point. Temperature measurements are typically reflected in and communicated by an electrical parameter, e.g., a voltage and/or current. The temperature measurement values may be advantageously communicated to the wireless controller via Layer 2 (L2) and/or Layer 3 (L3) signal messages.

According to the present disclosure, the temperature measurement may be processed in various ways to control and/or moderate system performance. Thus, in exemplary embodiments of the present disclosure, the temperature measurement is compared against one or more predetermined threshold values. Thus, if the temperature measurement meets or exceeds a first predetermined threshold level, a first corrective action is taken/initiated by the temperature control systems. In further embodiments of the present disclosure, if the temperature measurement meets or exceeds a second predetermined threshold level, a second (and potentially more aggressive) corrective action may be taken/initiated by the temperature control system. Additional levels of control/response based on further predetermined thresholds may be implemented as part of the disclosed temperature control system, as will be apparent to persons skilled in the art. The predetermined temperature level(s) that prompt corrective action may take the form of one or more temperature values, e.g., values set forth in a look-up table resident in computer memory associated with the temperature control system.

With further reference to the flow chart of FIG. 9, various corrective actions may be employed and/or initiated in response to an elevated temperature measurement, i.e., a temperature measurement that exceeds a predetermined threshold level, according to the systems and methods of the present disclosure. Thus, as shown in FIG. 9, one or more of the following actions may be initiated:

1) Reduction of the transmit power of the wireless transmitter associated with the access point evidencing an elevated temperature level;

2) Reduction of the throughput at the access point evidencing an elevated temperature level;

3) Reduction of the transmit power of the wireless transmitter associated with the access point evidencing an elevated temperature level; and/or 4) Perform load balancing with respect to access point operations so as to minimize and/or reduce the load at access point(s) evidencing elevated temperature level(s). As disclosed herein, load balancing takes into account the traffic loading on neighboring access points as well as the "hot" access point(s).

Of note, the temperature sensor(s) associated with the disclosed access points continue to generate temperature measurements after the corrective action(s) are initiated. At such time as the temperature measurement falls below the threshold level, the corrective action may be automatically discontinued, i.e., through logic associated with the temperature control system. Alternatively, the corrective action(s) may only be discontinued when the temperature measurement falls so as to be below the predetermined threshold level by a preset amount or percentage, e.g., 2° C. below the predetermined threshold level. Accordingly, in exemplary embodiments of the present disclosure, corrective actions associated with the disclosed temperature control functionality are maintained for so long as required to moderate the temperature increase at an access point, and thereafter such corrective action is generally discontinued, whether in a step-wise or ramped fashion.

In the following paragraphs, exemplary implementations of the disclosed temperature control functionality are described in greater detail. As depicted in the flow chart of FIG. 9, each of the disclosed temperature control functionalities are responsive to transmitted/received temperature measurements associated with an access point.

1) Reduction of Transmit Power Level of Wireless Transmitter

According to exemplary "reduction of transmit power level" embodiments of the present disclosure, the transmit power level of an access point experiencing an elevated temperature is reduced in one, two or several modes so as to reduce the power level at such access point to effect a desired temperature reduction/moderation. For example, if the access point-at-issue includes dual radio functionality (802.11 a/b/g), the transmit power level of the "a" and/or "b/g" transmission modes may be reduced by a predetermined amount, e.g., a predetermined dB level. Such transmit power level is generally maintained at a reduced level until the temperature at the access point falls below a predetermined value. The transmit power level is lowered such that the Quality of Service to the client is not impacted negatively. To achieve this desired result, rough estimation of the distance between the client and access point is generally undertaken. A key method in doing so is to measure the received RSSI of the ACK frames from the client. As noted previously, the temperature control system (i.e., control circuitry/logic) may reside locally at the access point (e.g., in the case of a "fat" or decentralized access point) or may reside in a central/remote location (e.g., in the case of a centralized wireless system architecture and/or a "thin" access point). For fat/decentralized access point implementations, there is a greater risk that a reduction in transmit power may result in lost contact between a client/mobile unit and the access point. In centralized/thin access point implementations, the remote wireless controller may be programmed to transition communications from one access point, i.e., the access point for which the transmit power is being reduced, to a second access point that is operationally better equipped to maintain the communication link, e.g., by disassociating the client/mobile unit from the first access point and establishing an association with a second access point.

2) Reduction of Access Point Throughput

According to exemplary "reduction of access point throughput" embodiments of the present disclosure, the throughput at an access point experiencing an elevated temperature is throttled/reduced so as to reduce power utilization and heat generation. Based on temperature measurement(s) within an access point, e.g., on or in close proximity to a circuit board or other electronic component, a determination is made by the temperature control system as to whether the temperature has surpassed a predetermined threshold and, if so, throughput through one or more radio transmitters associated with the access point is reduced. Generally, the reduction in throughput will not result in a loss of contact between the access point and a client/mobile unit; rather, the reduced throughput generally translates to slower link speeds. In the case of a centralized wireless architecture, a central wireless controller generally receives the temperature measurement information and, if a predetermined threshold temperature is surpassed, initiates a desired corrective action, i.e., a reduction of the throughput at transmitting radio(s) associated with the access point. Of note, since the central wireless controller receives information from multiple access points associated with a wireless system installation, its corrective actions may be implemented across the access points and may serve to balance the performance of the wireless system by modifying the throughput (and potentially other operating variables) across the access point deployments.

3) Reduction/Modification of Transmit Power Level on Packet-by-packet Basis

According to exemplary "packet-by-packet transmit power level reduction/modification" embodiments of the present disclosure, the temperature control system may be adapted to reduce and/or modify the transmit power level for one or more radio transmitters associated with an access point on a packet-by-packet basis. Indeed, the noted reductions/modifications may be implemented at a more or less granular level, e.g., at a bit-by-bit level, packet-by-packet level, or frame-by-frame level. According to exemplary embodiments, the temperature control system includes an algorithm or look-up table whereby temperature measurements may be used to derive a desired reduction and/or modification to the transmit power level at a desired data communication level, i.e., bit, packet, frame, etc. The reduction/modification may be initiated in response to a temperature measurement that surpasses a predetermined threshold, but such reduction/modification may also be initiated independent of a predetermined threshold level, i.e., on an ongoing basis based on current temperature measurements at the access point. In this way, heat generation/dissipation may be moderated on an ongoing basis, e.g., with respect to one, two or more radio transmitters, rather than awaiting a temperature measurement that surpasses a given threshold.

According to exemplary embodiments of the disclosed packet-by-packet power control system, the disclosed temperature control system is preferably adapted to estimate the distance of a client/mobile unit from an access point, e.g., based on known techniques, and to adjust the transmit power level so as to closely approximate the minimum power level required to communicate with such client/mobile unit from a given access point. Exemplary techniques for estimating the location of a client/mobile unit include triangulation by the wireless controller, estimates as to the time of arrival of a transmission by the access point, and/or use of the received power level of an ACK communication, i.e., the communications code sent from a receiving station to a transmitting station to indicate that it is ready to accept data or to acknowledge error-free receipt of transmitted data packets, from the client/mobile unit. It is further contemplated that the signal-to-noise ratio of the ACK communication received by the access point may be used to estimate the location/distance of a client/mobile unit according to the present disclosure.

The temperature system may be adapted to control/adjust multiple performance parameters to achieve desired temperature control results while simultaneously maintaining overall system performance. Thus, for example, modifications to both power level and transmission speed may be implemented according to the present disclosure. In such implementations, the power level may be reduced at the same time that the maximum speed of the transmission is reduced, thereby reducing heat generation/dissipation while maintaining system operations at an acceptable level. By simultaneous and/or concerted modifications to both operating parameters, the client/mobile unit is unlikely to experience any change in overall throughput and/or performance.

4) Load Balancing Across Access Points

According to exemplary "load balancing" embodiments of the present disclosure, a centralized wireless system architecture is leveraged to support corrective actions that, at least in part, control or moderate temperature conditions at or within one or more access points associated with the wireless system. The access points are generally adapted to report/transmit measurements with respect to multiple variables to the wireless controller. Typically, temperature is among the variables measured and reported/transmitted, as is access point utilization. Based on the reported/transmitted measurements, the disclosed wireless controller is advantageously adapted to take several possible actions:

(a) Disassociate one or more of the clients/mobile units from a highly utilized access point, transferring such client(s)/mobile unit(s) to one or more access points within range that is/are experiencing less traffic and/or are better able to handle additional communications traffic;

(b) Initiate reductions in power utilization at access points that are experiencing elevated temperature conditions, e.g., temperature levels above a threshold level. As noted above, reductions in power utilization may be achieved in various ways, e.g., by reducing the transmit power level and/or reducing the access point throughput.

(c) Map out the number of "a", "b/g", "N" and "x" clients/mobile units interacting with the access points associated with the wireless system and distribute/redistribute the access point interactions so as to minimize and/or eliminate dual-mode and/or multi-mode operations at a single access point. Thus, a first access point may be dedicated to "a" mode communications, whereas a second access point may be dedicated to "b/g" mode communications, thereby reducing the heat generation/dissipation at each of the first and second access points.

(d) Reduce and/or modify the transmit power level for one or more radio transmitters associated with access point(s) included in the wireless system at a bit-by-bit level, packet-by-packet level, or frame-by-frame level, thereby reducing heat generation/dissipation at such access point(s).

(e) Reduce the throughput in or at the "hot" access point(s).

In a further embodiment of the present disclosure, temperature control functionality is provided that allows continued operation of the crystal oscillator associated with the wireless communication functionality despite an increase in temperature, e.g., to a temperature of above 85° C. According to such further embodiment, temperature sensor(s) are associated with the circuit board or other electronic components within an access point. Based on temperature measurements of such sensor(s), a processing regimen (e.g., an algorithm or look-up table) translates temperature changes into voltage corrections that can be fed to a TCVCXO (temperature controlled/voltage controlled crystal oscillator) or other oscillator component, to insure undisrupted operation of the oscillator. Thus, for example, the temperature values measured by the temperature sensor(s) may be compared by a processor to a predefined table which maps the amount of deviation from a predetermined temperature threshold (e.g., 85° C.) to a pre-specified error voltage signal. The table may be populated through empirical determinations or calculations. The selected error voltage signal is then fed to the oscillator, e.g., a TCVCXO, to alter the voltage delivered to such oscillator, thereby reducing/moderating heat generation/dissipation associated therewith.

In each of the foregoing embodiments or independent thereof, it is contemplated according to the present disclosure that a cooling mechanism, e.g., a fan, may be positioned within or in close juxtaposition to an access point. The cooling mechanism may be advantageously actuated in response to temperature measurement(s) obtained from sensor(s) associated with the access point. Thus, for example, the cooling mechanism may be actuated and/or increased in speed/effect based on a temperature reading that exceeds a predetermined threshold. In this way, the temperature of the access point may be further controlled/moderated based on predetermined operational criteria.

With further reference to FIGS. 1-8, exemplary access point 10 further includes a rear plate 98 that cooperates with front housing member 12 and generally corresponds to the rectangular geometry of front housing member 12. Slots 99 formed in the side walls 97 of rear plate 98 cooperate with the corresponding venting notches 38 of front housing member 12 to promote air flow and the overall aesthetic appearance of exemplary access point 10. Screws 102 cooperate with apertures 100 and secure rear plate 98 with respect to front housing member 12, thereby encasing the operative components of access point 10 therewithin. A rear housing 106 is mounted with respect to rear plate 98 by a bolt/flange arrangement 104 or other connection means. Alternatively, rear housing 106 may be integrally formed with rear plate 98, e.g., through an appropriate molding operation.

Rear housing 106 is configured and dimensioned to fit within a conventional wall box, i.e., a single gang box. Despite the geometric and dimensional constraints placed on rear housing 106, a cavity 108 is defined by rear housing 106 that is of sufficient size/volume to accommodate operative components of access point 10, including specifically the three circuit boards 46, 80, 82, the additional electronic components 90, 92, at least the rearward portion of jack 26, and the rearwardly directed plug 50. As noted previously, the antennae are generally mounted to the front housing member 12 and, as such, are not received within cavity 108. In addition, the overall internal layout and geometry of access point 10 is effective to achieve desired air flow/cooling to avoid issues associated with potential overheating of components. In exemplary embodiments, heat management is further achieved through the temperature sensor and control circuitry associated with the printed circuit board(s).

In use, access point 10 is assembled in the manner shown in FIG. 2, with jack 26 exposed at the front and plug 50 exposed in the rear. A cable, conduit or other appropriate wiring is fed to the electrical box that is to receive the access point, e.g., a wall box. The cable/conduit is provided with an RJ-45 jack so as to mate with the outwardly/rearwardly directed plug 50 associated with the disclosed access point 10. The cable/conduit is also generally in electrical communication with one or more network components, e.g., one or more switches, routers, servers and the like. In an exemplary embodiment of the present disclosure, the cable/conduit is in communication with, inter alia, a wireless controller, e.g., a mobility controller available from Aruba Networks (Sunnyvale, Calif.), so as to support wireless communications by and through access point 10.

Once the cable/conduit is electrically connected to the access point by engaging plug 50 with the associated jack, the rear housing 106 is generally advanced into the electrical box such that the rear plate 98 is brought into contact with the wall or other surface with respect to which it is being mounted. Access point 10 is then typically mounted with respect to the standard mounting apertures on the electrical box, the covers 16, 18 are snapped into place, and the access point 10 is ready for operation. Users can snap an RJ-45 plug into jack 26 and/or engage in wireless communication via access point 10, thereby gaining network access in a wireless manner. In exemplary embodiments, users are able to engage in wireless communications at both 2.4 GHz (IEEE 802.11b/g) and 5 GHz (IEEE 802.11a).

In operation, the printed circuit boards 46, 80, 82 generally provide the circuitry to support operation of access point 10, including specifically: (i) the receipt and processing of data transmissions transmitted from a cable/jack that is connected with outwardly/rearwardly directed RJ-45 plug 50, e.g., data input from an associated network and wireless control system, (ii) the delivery of the data transmissions to the RJ-45 jack 26, (iii) the wireless transmission and receipt of data by way of the antennae, (iv) the processing of power received from the cable/jack connected to RJ-45 plug 50, i.e., power-over-Ethernet, (v) the control of indicators 40, 44, (vi) temperature control operations, and (vii) related processing operations.

Figure 3:
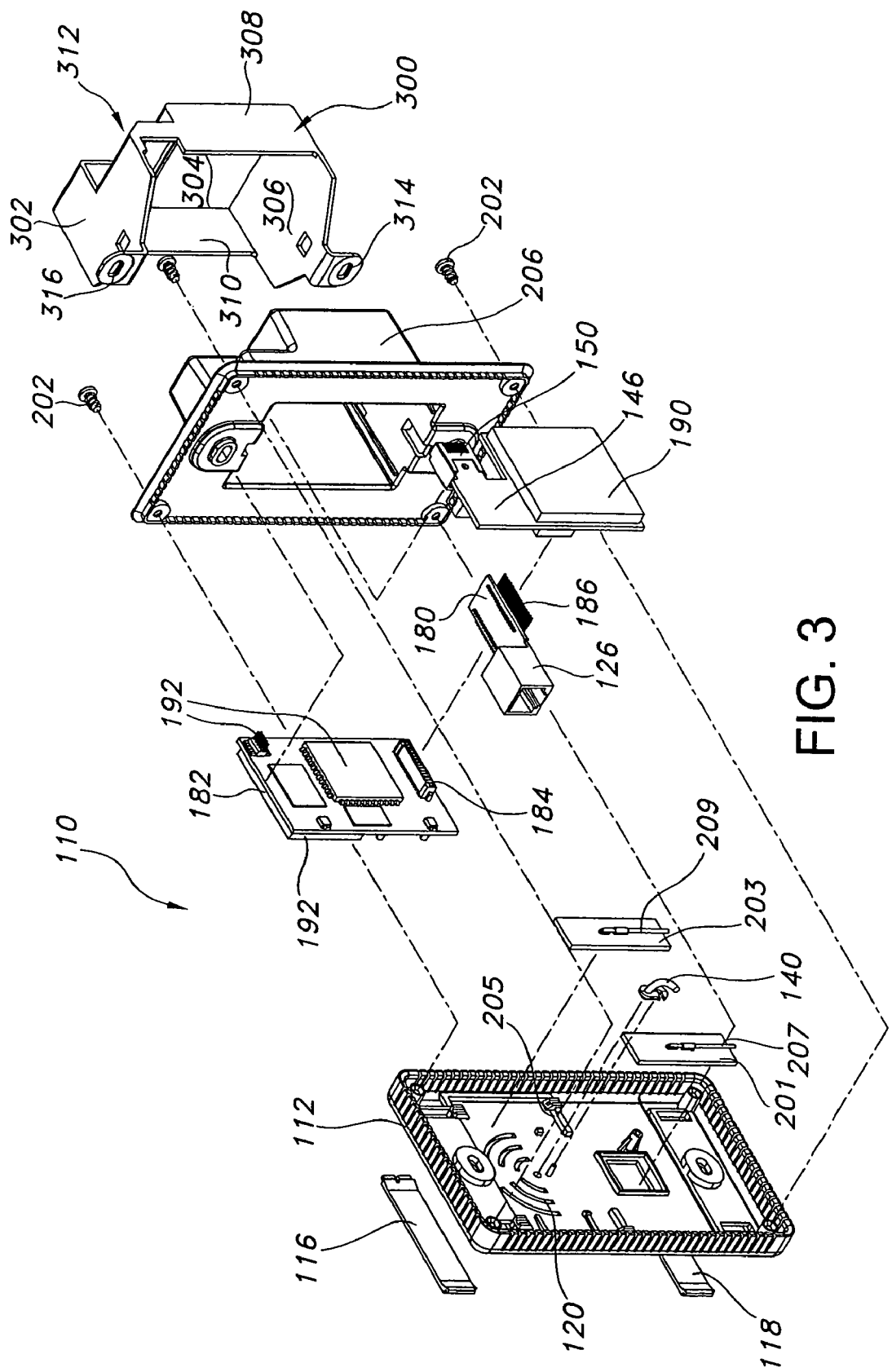
FIG. 3 is an exploded view of a second exemplary access point device and associated wall-mounting receptacle according to the present disclosure.
Figure 4:
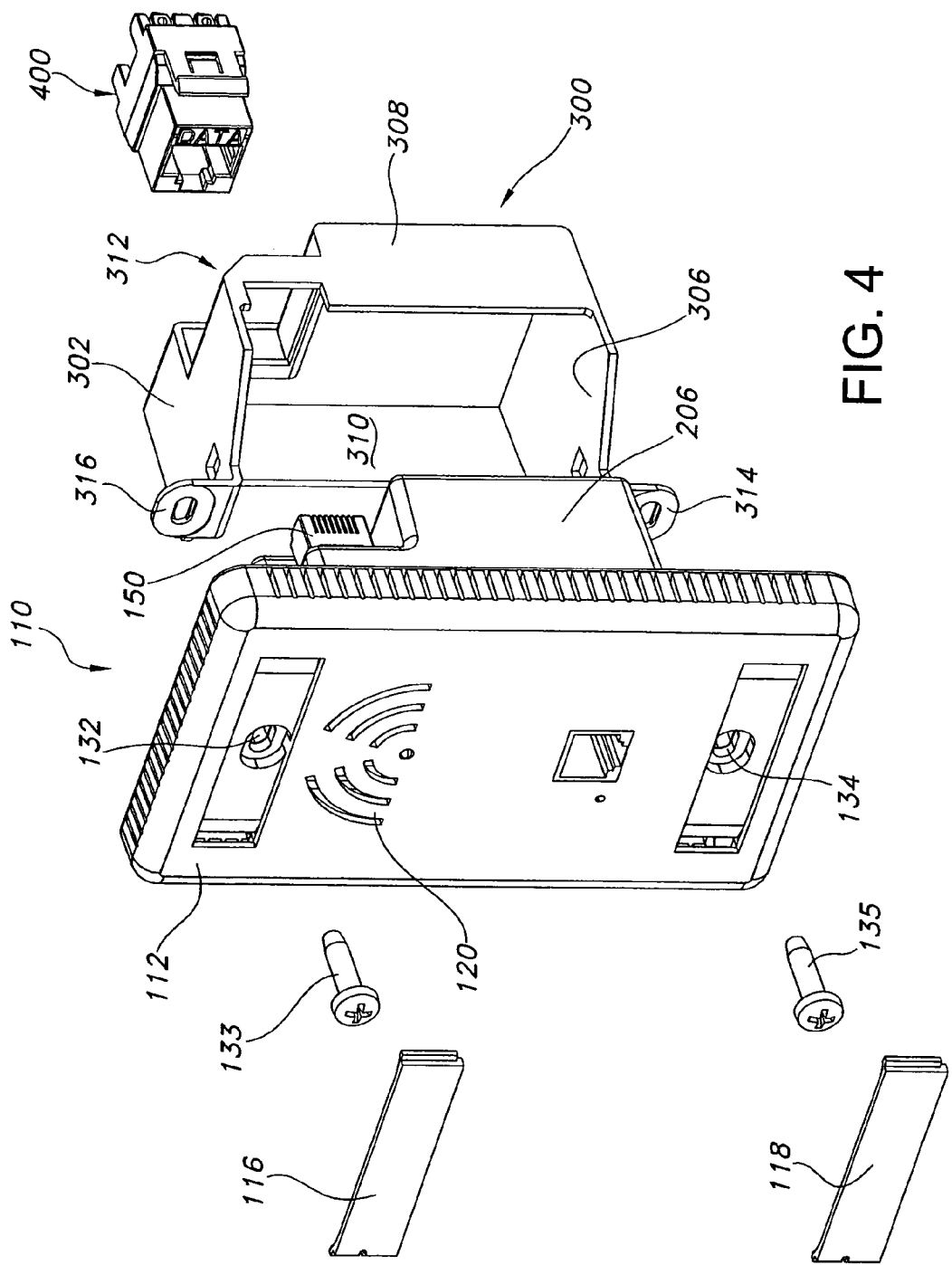
FIG. 4 is a partially exploded front view of the second exemplary access point device and associated wall-mounting receptacle of FIG. 3.
Figure 5:
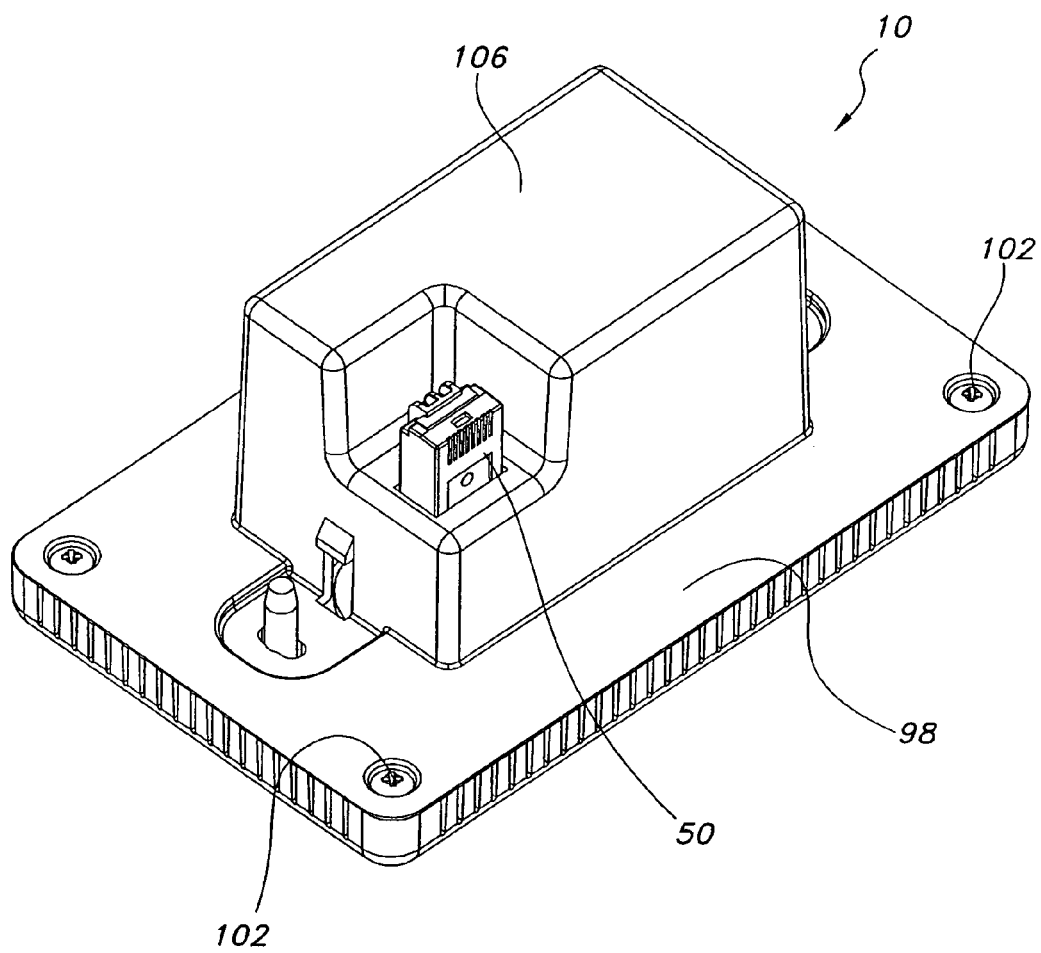
FIG. 5 is a rear view of an exemplary access point device of the present disclosure.

Turning to FIGS. 3 and 4, a second exemplary access point 110 is schematically depicted in exploded form. To the extent components and/or features associated with access point 110 may be associated with a corresponding component and/or feature of access point 10, such component/feature has been identified by a designation incremented by 100. Thus, access point 110 includes a front housing member 112 that includes internal cavities that are adapted to be obscured by covers 116, 118. Screws 133, 135 may be used to mount access point 112 with respect to receptacle 300, as described in greater detail below. Vent slots 120 are formed in front housing member 112 and are of a substantially arcuate configuration. As noted previously, alternative venting slot configurations may be employed, e.g., for aesthetic purposes, as will be apparent to persons skilled in the art.

With particular reference to FIG. 4, access point 112 includes three printed circuit boards 146, 180, 182 that are adapted to be assembled in a substantially H-shaped or U-shaped configuration. Communication interface members 184, 186 facilitate electrical communication between circuit boards 180, 182 and circuit boards 146, 180, respectively. Light pipe 140 transmits signal illumination to an indicator location on the face of front housing member 140 and, in exemplary embodiment, sits on or in close juxtaposition to an LED positioned on one of the circuit boards 146, 180, 182. In the exemplary embodiment of FIGS. 3 and 4, a single indicator is employed, rather than the multiple indicators disclosed with reference to exemplary access point 10. Additional electrical components 190, 192 are mounted with respect to printed circuit boards 146, 182, respectively. As shown with respect to printed circuit board 182, such additional electrical components 192 may be mounted on either side (or both sides) thereof.

A pair of antennae 201, 203 are mounted to the internal side of front housing member 112 in a spaced manner, i.e., with one toward the left side of front housing member 112 and the other toward the right side of front housing member 112. Mounting channels 205 are defined on the inner side of front housing member 112 to accommodate the antennae, although alternative mounting techniques may be employed, as will be readily apparent to persons skilled in the art. Each antenna 201, 203 includes a connecting member 207, 209, respectively, for effecting electrical communication between the antenna and the printed circuit boards 146, 180, 182. As with access point 10 described above, the antennae 201, 203 are advantageously adapted to transmit and receive wireless communication in dual-mode, i.e., at both 2.4 GHz (IEEE 802.11b/g) and 5 GHz (IEEE 802.11a).

As with access point 10 described above, the circuit boards 146, 180, 182 and associated components, e.g., interface members 184, 186, electrical components 190, 192 and jack 126, of access point 110 is advantageously effected within the dimensions and geometry of a conventional electrical box, e.g., a one-gang wall box. Thus, access point 110 includes a rear housing 206 that is configured and dimensioned to fit within such electrical box, and the noted access point components may be advantageously positioned therewithin.

As with access point 10, the alternative exemplary access point 110 is effective in supporting network-based communications, e.g., in a wired form via jack 126 and/or in a wireless form via the wireless functionality supported by antennae 201, 203 and the associated circuitry/capabilities associated with access point 110. Power is supplied to access point 110 in a PoE form, i.e., it is delivered to access point 110 over the cable/conduit in electrical communication with outwardly/rearwardly directed plug 150. Signal, power and related processing management functions are achieved by the printed circuit boards 146, 180, 182 (and associated electrical components 190, 192).

With further reference to FIGS. 3 and 4, an advantageous receptacle 300 is schematically depicted. Receptacle 300 includes a base 306, side walls 308, 310, top face 302 and rear wall 304. Upper and lower mounting apertures/flanges 316, 314 are defined by receptacle 300 to facilitate interaction with an electrical device, e.g., an access point 10, 110. Unlike conventional electrical receptacles, however, receptacle 300 defines an open corner region 312 that facilitates engagement of a plug/jack, e.g., plug 150 of access point 110, and jack 400 (see FIG. 4). Thus, the open corner region 312 of exemplary receptacle 300 is defined by incomplete side wall 308, incomplete rear wall 304, and incomplete top face 302, such that a block-shaped open region is defined.

Receptacle 300 is particularly advantageous for use with exemplary access points 10, 110 because, inter alia, the outwardly/rearwardly projecting plug 50, 150 protrudes into and/or aligns with the open corner region 312 of receptacle 300. As shown in the rear view of FIG. 5, plug 50 (which, for present purposes, is identical to plug 150) protrudes into a block-like cavity region. The block-like cavity region defined at the rear of and external to access point 10 substantially corresponds to the open corner region 312 defined by receptacle 300. Due to this geometric and dimensional correspondence, access to plug 50, 150 is greatly facilitated and connection to a jack, e.g., jack 400, can be accomplished with ease and without potential damage to either the plug or jack assemblies, e.g., damage caused by aggressive manipulation and/or bending.

In sum, the present disclosure provides advantageous access point devices, access point systems and associated assemblies, subassemblies and support structures. Although the devices, systems and methods of the present disclosure have been described with reference to exemplary embodiments thereof, the present disclosure is not limited to or by such exemplary embodiments. Rather, the devices, systems and methods of the present disclosure may be subjected to various enhancements, modifications and/or variations without departing from the spirit or scope of the present disclosure. Accordingly, the scope of the present disclosure is expressly intended to encompass such enhancements, modifications and/or variations within the scope of the claims set forth herein.

The invention claimed is:

1. An access point, comprising:
    a. electrical components that support data communication operations;
    b. at least one temperature measurement component positioned in close proximity to at least one of said electrical components; and
    c. temperature control means in communication with the at least one temperature component, the temperature control means responding to a temperature reading that exceeds a predetermined threshold by load balancing among a plurality of access points to reduce heat generation by at least one of said electrical components.

2. An access point according to claim 1, wherein the electrical components include at least one radio transmitter.

3. An access point according to claim 2, wherein the temperature control means further responds to a temperature reading that exceeds a predetermined threshold by reducing transmit power associated with the at least one radio transmitter.

4. An access point according to claim 2, wherein the temperature control means further responds to a temperature reading that exceeds a predetermined threshold by reducing transmit power associated with the at least one radio transmitter on a bit-by-bit, packet-by-packet or frame-by-frame basis.

5. An access point according to claim 1, wherein the electrical components include radio transmitters that operate in the 2.4 GHz and 5 GHz bands.

6. An access point according to claim 5, wherein the temperature control means responds to a temperature reading that exceeds a predetermined threshold by selectively reducing at least one of radio transmission transmit power and radio transmission throughput in the 2.4 GHz or 5 GHz band.

7. An access point according to claim 6, further comprising a second access point that includes radio transmitters that operate in the 2.4 GHz and 5 GHz bands, and wherein the temperature control means limits operation of the first access point to the 5 GHz band and limits operation of the second access point to the 2.4 GHz band.

8. An access point according to claim 1, wherein the temperature control means further responds to a temperature reading that exceeds a predetermined threshold by reducing throughput through the electrical components.

9. An access point according to claim 1, wherein the temperature control means is located within a housing that defines the access point.

10. An access point according to claim 1, wherein the temperature control means is located remote from a housing that defines the access point.

11. An access point according to claim 10, wherein the temperature control means is located, at least in part, in a wireless controller that communicates with the electrical components from a remote location.

12. An access point according to claim 1, wherein the electrical components include at least one printed circuit board and the at least one temperature measurement component is mounted with respect to the at least one printed circuit board.

13. An access point according to claim 1, wherein the temperature control means includes a processing member that receives a temperature measurement from the at least one temperature measurement component and compares such temperature measurement to a predetermined temperature threshold.

14. An access point according to claim 13, wherein the processing member compares the temperature measurement to a look-up table containing temperature deviation values.

15. An access point according to claim 14, wherein the processing member generates an error voltage signal in response to the temperature deviation value identified in the look-up table and transmits the error voltage signal to an oscillator associated with wireless communications.

16. An access point according to claim 15, wherein the oscillator is a TCVCXO.

17. An access point according to claim 1, further comprising a cooling mechanism and wherein the temperature control means actuates the cooling mechanism in response to a temperature reading that exceeds a predetermined threshold.

18. A wireless system, comprising:
a. a wireless controller;
b. a first access point in communication with the wireless controller, the first access point including first electrical components that support data communication operations and a first temperature measurement component;
c. a second access point in communication with the wireless controller, the second access point including second electrical components that support data communication operations and a second temperature measurement component;
d. temperature control means that resides at least in part in the wireless controller, the temperature control means adapted to receive temperature values from the first and second temperature measurement components and to transmit control signals to the first and second electrical components to control heat generation associated with operation of the first and second electrical components.

19. A wireless system according to claim 18, wherein the first and second electrical components each include at least one radio transmitter.

20. A wireless system according to claim 19, wherein the temperature control means responds to a temperature reading from the first access point that exceeds a predetermined threshold by reducing transmit power associated with the radio transmitter associated with the first access point.

21. A wireless system according to claim 19, wherein the temperature control means responds to a temperature reading from the first access point that exceeds a predetermined threshold by reducing transmit power associated with the radio transmitter associated with the first access point on a packet-by-packet or frame-by-frame basis.

22. A wireless system according to claim 18, wherein the first and second electrical components include radio transmitters that operate in the 2.4 GHz and 5 GHz bands.

23. A wireless system according to claim 22, wherein the temperature control means responds to a temperature reading associated with the first access point that exceeds a predetermined threshold by selectively reducing radio transmissions of the first access point in the 2.4 GHz or 5 GHz band.

24. A wireless system according to claim 23, wherein the temperature control means limits operation of the first access point to the 5 GHz band and limits operation of the second access point to the 2.4 GHz band.

25. A wireless system according to claim 18, wherein the temperature control means responds to a temperature reading associated with the first access point that exceeds a predetermined threshold by reducing throughput through the electrical components of the first access point.

26. A wireless system according to claim 18, wherein the temperature control means responds to a temperature reading associated with at least one of the first and second access points that exceeds a predetermined threshold by load balancing between the first and second access points.

27. A wireless system according to claim 18, wherein the temperature control means includes a processing member that receives a temperature measurement from at least one of the first and second access points and compares such temperature measurement to a predetermined temperature threshold.

28. A wireless system according to claim 27, wherein the processing member compares the temperature measurement to a look-up table containing temperature deviation values.

29. A wireless system according to claim 28, wherein the processing member generates an error voltage signal in response to the temperature deviation value identified in the look-up table and transmits the error voltage signal to an oscillator associated with wireless communications.

30. A wireless system according to claim 18, further comprising a cooling mechanism associated with at least one of the first and second access points, and wherein the temperature control means actuates the cooling mechanism in response to a temperature reading for such access point that exceeds a predetermined threshold.

31. A wireless system according to claim 18, further comprising a plurality of additional access points.

32. An access point, comprising:
   a. electrical components that support data communication operations;
   b. at least one temperature measurement component positioned in close proximity to at least one of said electrical components; and
   c. temperature control means in communication with the at least one temperature component, the temperature control means responding to a temperature reading that exceeds a predetermined threshold to reduce heat generation by at least one of said electrical components;
   wherein the temperature control means is located remote from a housing that defines the access point and wherein the temperature control means is located, at least in part, in a wireless controller that communicates with the electrical components from a remote location.

33. An access point, comprising:
   a. electrical components that support data communication operations;
   b. at least one temperature measurement component positioned in close proximity to at least one of said electrical components; and
   c. temperature control means in communication with the at least one temperature component, the temperature control means responding to a temperature reading that exceeds a predetermined threshold to reduce heat generation by at least one of said electrical components;
   wherein the temperature control means includes a processing member that compares the temperature reading to a look-up table containing temperature deviation values and wherein the processing member generates an error voltage signal in response to the temperature deviation value identified in the look-up table and transmits the error voltage signal to an oscillator associated with wireless communications.

* * * * *